United States Patent
Leobandung et al.

(10) Patent No.: US 11,934,094 B2
(45) Date of Patent: Mar. 19, 2024

(54) MASK FINGERPRINT USING MASK SENSITIVE CIRCUIT

(71) Applicant: INTERNATIONAL BUSINESS MACHINES CORPORATION, Armonk, NY (US)

(72) Inventors: Effendi Leobandung, Stormville, NY (US); Stephen Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 17/301,032

(22) Filed: Mar. 23, 2021

(65) Prior Publication Data

US 2022/0308441 A1    Sep. 29, 2022

(51) Int. Cl.
*G06F 30/32*  (2020.01)
*G01N 21/95*  (2006.01)
*G01R 31/317*  (2006.01)
*G03F 1/44*  (2012.01)

(52) U.S. Cl.
CPC ........... *G03F 1/44* (2013.01); *G01N 21/9501* (2013.01); *G01R 31/31703* (2013.01); *G06F 30/32* (2020.01)

(58) Field of Classification Search
CPC . G06F 1/44; G06F 30/32; G06F 13/16; G06F 13/4068; G06F 13/4265; G06F 30/39; G06F 11/1068; G06F 12/0646; G06F 12/0802; G06F 12/1458; G06F 13/1657; G06F 13/1668; G06F 15/786; G06F 2212/1056; G06F 2212/60; G06F 2212/7202; G06F 12/0871; G06F 21/73; G06F 21/79; G01N 21/9501; H01L 2223/54453; H01L 23/544; H01L 22/34; H01L 2225/06527; H01L 2225/06541; H01L 23/5382; G03F 1/44; G03F 1/68
USPC ..................................................... 716/50–56
See application file for complete search history.

(56) References Cited

U.S. PATENT DOCUMENTS

| | | | |
|---|---|---|---|
| 4,233,682 | A | 11/1980 | Liebergot |
| 4,975,876 | A | 12/1990 | Haulin |
| 6,154,074 | A | 11/2000 | Nakashima |
| 6,216,253 | B1 | 4/2001 | Maeda |

(Continued)

OTHER PUBLICATIONS

Mell et al., "The NIST Definition of Cloud Computing", Recommendations of the National Institute of Standards and Technology, Special Publication 800-145, Sep. 2011, 7 pages.

*Primary Examiner* — Binh C Tat
(74) *Attorney, Agent, or Firm* — L. Jeffrey Kelly

(57) ABSTRACT

According to a first aspect of the present invention, there is provided a method, a computer system and a computer program product. The method, computer system and computer program product including measuring an initial state of a set of SRAM bits on the wafer, identifying a first set of signature SRAM bits on the wafer, of the set of SRAM bits on the wafer, where the first set of SRAM bits comprise a consistent initial state greater than a first threshold percentage of times, measuring physically dimensions of features of the first set of SRAM bits on the wafer; and identifying a set of signature SRAM bits of the first set of SRAM bits on the wafer, wherein the set of signature SRAM bits comprise physical dimensions of features which correlate to the initial state of each correlated SRAM bit.

13 Claims, 7 Drawing Sheets

(56) References Cited

U.S. PATENT DOCUMENTS

| | | |
|---|---|---|
| 6,530,074 B1 | 3/2003 | Genetti |
| 6,656,647 B2 | 12/2003 | Gerstmeier |
| 6,773,937 B1 | 8/2004 | Ho |
| 7,458,058 B2 | 11/2008 | Parikh |
| 7,890,908 B2 | 2/2011 | Nojima |
| 9,495,627 B1 | 11/2016 | Annunziata |
| 10,769,327 B1 | 9/2020 | Leobandung |
| 2004/0216061 A1 | 10/2004 | Floyd |
| 2008/0080277 A1* | 4/2008 | Lee ........................ G11C 29/50 324/759.02 |
| 2008/0167829 A1* | 7/2008 | Park ................... G01R 31/2894 702/81 |
| 2008/0172190 A1* | 7/2008 | Lee ................... G01R 31/3004 702/59 |
| 2016/0292492 A1* | 10/2016 | Amzaleg ................ G06V 40/33 |
| 2018/0238958 A1* | 8/2018 | Song ................... G01R 31/2894 |
| 2020/0212031 A1 | 7/2020 | Tucker |
| 2020/0219827 A1 | 7/2020 | Leobandung |
| 2020/0356085 A1* | 11/2020 | Wentz ................... H04L 9/0866 |

\* cited by examiner

MASK FINGERPRINT USING MASK SENSITIVE CIRCUIT

BACKGROUND

The present invention relates generally to semiconductors, and more specifically, to semiconductor device security.

The requirement to provide security in computer systems has led to the development of a variety of approaches for uniquely confirming that manufactured microprocessors and other semiconductor devices have been fabricated according to design data without any alteration.

Design of semiconductor devices may be done at a fabless company which does not manufacture the semiconductor devices. The design data is sent to a foundry for fabrication. There may be a concern that the design data and/or mask data may be intentionally altered or made counterfeit. This may result in a semiconductor device with a lower quality and possibly with maliciously added circuits. Traditionally visual wafer inspection may be used to inspect chips. However, it is not feasible to perform visual wafer inspection on every wafer due to a cost of equipment used and a significant time-intensive expense per wafer.

SUMMARY

According to a first aspect of the present invention, there is provided a method, a computer system and a computer program product. The method, computer system and computer program product including measuring an initial state of a set of SRAM bits on the wafer, identifying a first set of signature SRAM bits on the wafer, of the set of SRAM bits on the wafer, where the first set of SRAM bits comprise a consistent initial state greater than a first threshold percentage of times, measuring physically dimensions of features of the first set of SRAM bits on the wafer; and identifying a set of signature SRAM bits of the first set of SRAM bits on the wafer, wherein the set of signature SRAM bits comprise physical dimensions of features which correlate to the initial state of each correlated SRAM bit.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
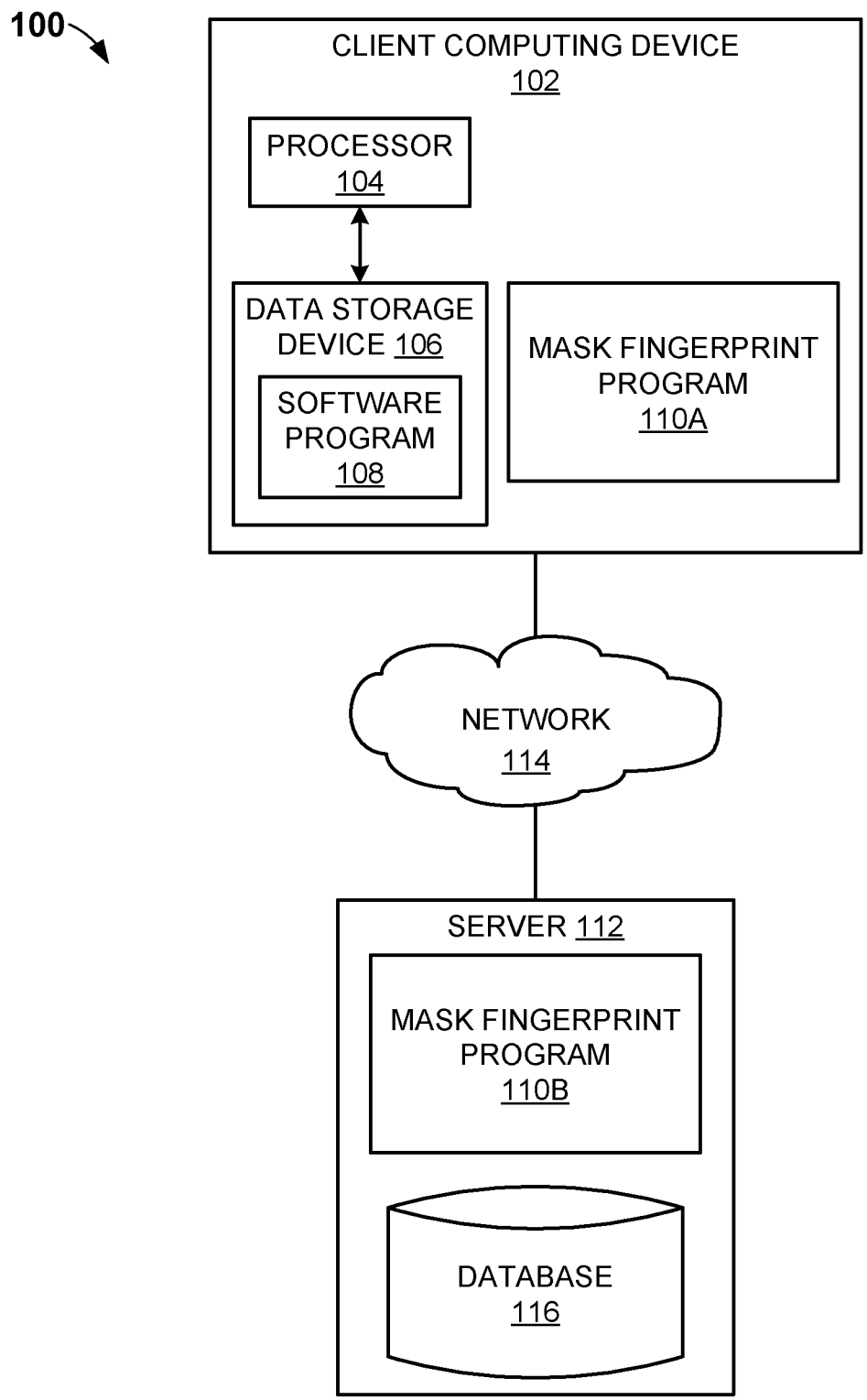
FIG. 1 depicts an exemplary networked computer environment according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to semiconductors, and more particularly to semiconductor device security. The following described exemplary embodiments provide a system, method, and program product to, among other things, verify a manufactured wafer containing chips or die matches design data which has been sent to a third party for fabrication. Therefore, the present embodiment has the capacity to improve the technical field of semiconductor device security by verifying a fabricated wafer has been manufactured according to the design data provided to the third party.

As previously described, the requirement to provide security in computer systems has led to the development of a variety of approaches for uniquely confirming that microprocessors and other semiconductor devices have been fabricated according to design data without any alteration. Design of semiconductor devices may be done at a fabless company which does not manufacture the semiconductor devices. The design data is sent to a foundry for fabrication. There may be a concern that the design data and/or mask data may be intentionally altered or made counterfeit. This may result in a semiconductor device with a lower quality and possibly with maliciously added circuits. Traditionally visual wafer inspection is used to inspect chips. However, it is not feasible to perform visual wafer inspection on every wafer due to a cost of equipment used and a significant time-intensive expense per wafer.

The fabless company may design a semiconductor device and design a mask or a set of masks to be used for manufacturing of the semiconductor device on a wafer. Typically, the set of masks are provided to a foundry for fabrication of the wafer. Each mask may be used during photolithography. During such photolithography, a wafer (e.g., silicon wafer) is coated with a chemical called a photoresist. A mask is placed over the wafer and select portions of the wafer under the mask are exposed to light (e.g., short wavelength light). The exposed regions are washed away by a developer solution. Conventional semiconductor device manufacturing processes can and will produce acceptable defects. After manufacturing, the wafers are tested to verify the provided set of masks were used without any modification.

According to an embodiment, an initial state of SRAM bits may be measured on a complete chip. SRAM bits with a consistent initial state may be identified, physical characteristics which align with the consistent initial state of the identified SRAM bits may confirm the initial state, physical characteristics may be compared to a witness wafer or pulled wafer and a visual inspection done on the witness wafer may be performed. The confirmed SRAM bits with a consistent initial state may be considered signature bits and together define a mask fingerprint. The mask fingerprint will include those confirmed SRAM bits which are mask sensitive. This means that although every SRAM bit of a chip may have the exact same design parameters, once manufactured, some of the SRAM bits on chips have a consistent start up state due to minor variations which occur during manufacturing of the specific mask or design of the chip. Once the mask fingerprint is defined, it can be used as a screen or test additional chips manufactured from the same design data. Chips to be tested can be screened for SRAM bits with a consistent start up state. Those chips with SRAM bits with a consistent start up state which match the signature bits may be considered to be manufactured using the same original design mask without alteration.

The following described exemplary embodiments provide a system, method, and program product to verify a manufactured wafer containing chips or die matches design data which has been sent to a third party for fabrication.

Referring to FIG. 1, an exemplary networked computer environment 100 is depicted, according to an embodiment. The networked computer environment 100 may include client computing device 102 and a server 112 interconnected via a communication network 114. According to at least one implementation, the networked computer environment 100 may include a plurality of client computing devices 102 and servers 112, of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Figure 6:
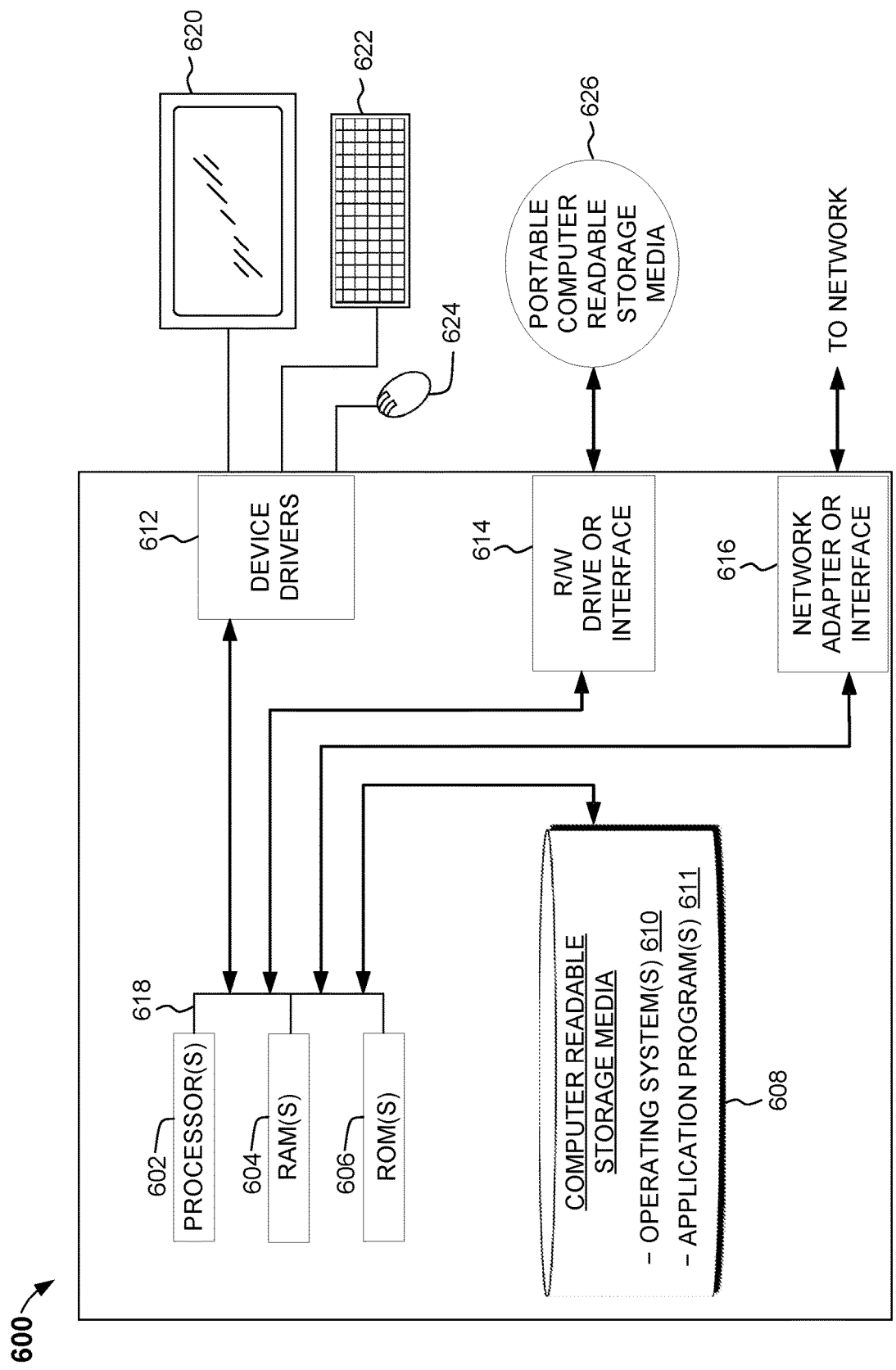
FIG. 6 depicts a block diagram of internal and external components of computers and servers depicted in FIG. 1 according to an embodiment.

Client computing device 102 may include a processor 104 and a data storage device 106, for example the one or more computer readable storage media 608 of FIG. 6, that is enabled to host and run a software program 108 and a mask fingerprint program 110A and communicate with the server 112 via the communication network 114, in accordance with an embodiment of the invention. Client computing device 102 may be, for example, a mobile device, a telephone, a personal digital assistant, a netbook, a laptop computer, a tablet computer, a desktop computer, or any type of computing device capable of running a program and accessing a network.

The server 112 may be a laptop computer, netbook computer, personal computer (PC), a desktop computer, or any programmable electronic device or any network of programmable electronic devices capable of hosting and running a mask fingerprint program 110B and a database 116 and communicating with the client computing device 102 via the communication network 114, in accordance with embodiments of the invention. As will be discussed with reference to computing device 600 of FIG. 6, the server computer 112 may include internal components and external components, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

According to the present embodiment, the mask fingerprint program 110A, 110B may be a program capable of verifying a manufactured wafer containing chips or die matches design data which has been sent to a third party for fabrication. The mask fingerprinting using sensitive circuit method is explained in further detail below with respect to FIGS. 2-8.

Figure 2:
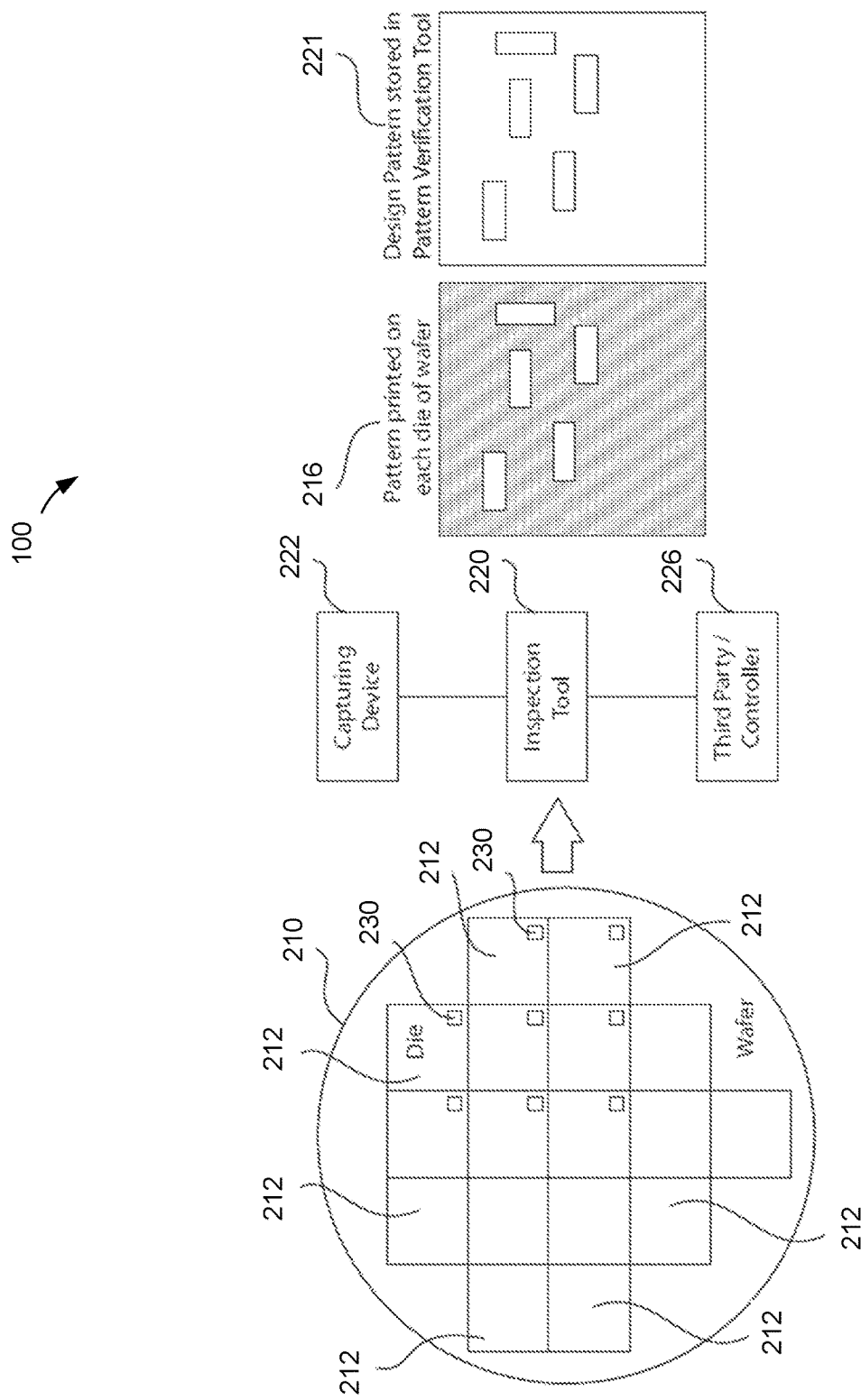
FIG. 2 depicts an example inspection tool according to an embodiment.

Referring now to FIG. 2, a block/flow diagram of an example inspection tool employed to compare a pattern printed on a wafer with an original design pattern is shown, in accordance with an embodiment of the present invention.

Wafer 210 includes a plurality of chips 212. The chips 212 can be referred to as die. The terms chips and die can be used interchangeably. A portion of each chip 212 of the wafer 210 can be marked by an identifier 230. The identifier 230 can be any design characteristic or layout. For example the identifier 230 may be a memory array, such as, but not limited to, a static random access memory (SRAM) array. The SRAM array can be a small SRAM array (1-100 kB).

An inspection tool 220, also referred to as a pattern verification tool, can be used to inspect each chip 212 of the wafer 210. In most cases, the inspection tool 220 uses a capturing device 222 to inspect each chip 212 of wafer 210. For example, the capturing device 222 may include a high-resolution camera. The inspection tool 220 can scan each chip 212 by employing, e.g., a scanning electron microscope (SEM). The inspection tool 220 can be secured physically and electronically to avoid tampering. The inspection tool 220 can perform a Die to Database (D2DB) inspection by comparing a printed pattern 216 on each chip 212 to the database of an initial design pattern 221 stored in the inspection tool 220, such as an e-beam defect inspection tool, on the wafer 210. The D2DB inspection may confirm each chip 212, and thus the wafer 210, has been manufactured according to the original design masks. The D2DB inspection may be performed by the identifier 230 and on additional portions of the wafer 210. The more portions of the wafer 210 which are inspected increase an accuracy of the inspection, however, the more portions of the wafer 210 which are inspected also increase a time and expense of the inspection of the wafer 210.

In an embodiment, optical inspection may be done by comparing each chip 212 to the database of the initial design pattern 221. These inspections are time and equipment intensive, and inspections of each individual wafer may not be feasible due to logistics and cost.

Inspection of the wafer 210 may be done by companies who design and create its own chips but does not own a semiconductor fabrication facility or plant (also referred to as a fab). The company who designed the chip needs to be assured that chips manufactured in by a third-party 226 are secure or uncompromised by, e.g., malicious content.

Figure 3:
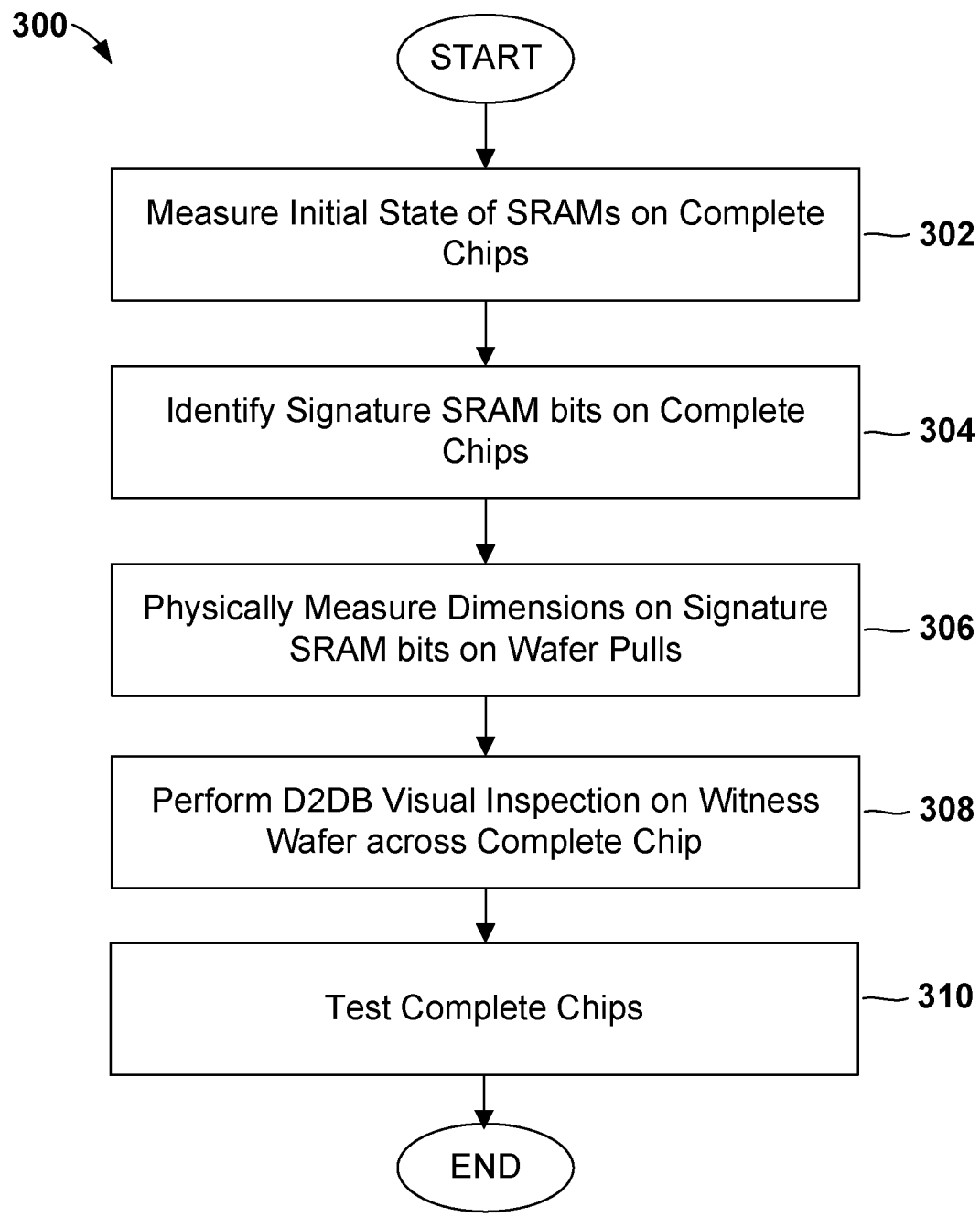
FIG. 3 depicts an operational flowchart illustrating a chip inspection process according to an embodiment.

Referring now to FIG. 3, an operational flowchart illustrating a chip inspection process 300 is depicted according to an embodiment.

At block 302, the mask fingerprint program 110A, 110B determines an initial state of SRAM bits on a completed chip. In an embodiment, there may be 100 chips on a semiconductor wafer. Each of the 100 chips may have circuitry for memory, eFPGAs (embedded field programmable grid arrays), a digital core, an analog block input/output interface, and other functions. In an embodiment, each of the 100 chips may have 1,000,000 SRAM bits. The SRAM bits on the chip may be randomly distributed throughout the chip. In most cases, all SRAM bits have the same design pattern, including size and spacing, on each of the layers of the mask provided for manufacturing. However, during manufacturing, some natural variation of the physical characteristics of each SRAM bit may occur. The natural variation may be due to proximity and location of surrounding features, location on the chip, and other variations. During testing of the chip, at initial power up, each of the SRAM bits will have an initial state, for example a "1" or a "0". An SRAM bit is very sensitive to a size change, such as a slight variation in a gate size of one of the FETs (field-effect transistors) of the SRAM bit compared to another gate in another FET in the same SRAM bit. As such, the SRAM bit is mask sensitive, such that a slight variation during fabrication may result in something measurable which can be used as a mask fingerprint.

In alternate embodiments, different circuitry of the chip, other than SRAM bits, may be used to identify a portion of the chip which is mask sensitive. Different embodiments may include using a differential circuit which may be sensitive to a size change or variation during fabrication, a closed loop operational amplifier that may amplify a size change or variation during fabrication, or a differential race circuit using a latch, a NAND circuit, a NOR circuit, a comparator, each of which may be sensitive to a size change during fabrication, among other circuits.

At block 304, the mask fingerprint program 110A, 110B identifies signature SRAM bits which have a consistent initial state on a completed wafer. Generally, an initial state of an SRAM bit may be random, such that 50% of the time, for each SRAM bit, the initial state is a "0" and 50% of the time the initial state is a "1". However, a subset of the SRAM bits may have an initial state which is consistent. This means that a first subset of the SRAM bits may be "1" for greater than a threshold percentage of the time. For example, the threshold may be 80%. Additionally, a second subset of the SRAM bits may be "0" for greater than the threshold percentage of the time. The consistent start up state of first subset of the SRAM bits and the second subset of the SRAM bits may be due to the natural variation of physical characteristics during manufacture of the chip. It may be determined that the design masks used for fabrication of the chip determines an initial state of those SRAM bits with a consistent start up state. The first subset of the SRAM bits and the second subset of the SRAM bits together may be referred to as signature bits. The signature bits are a result of an unintentional mask bias which is consistent across most chips. In an embodiment, several SRAM bits from more than one completed wafer may be tested to help identify signature bits.

An altered design mask may result in a different set of SRAM bits with a consistent start up state. Identifying those SRAM bits with a consistent start up state with the original design mask may be a way to identify chips fabricated with the original design mask. The signature bits may be considered sensitive circuits and be used for mask fingerprinting of the chip and wafer.

The original design company (chip designer) expects that the third party 226 will use the original design masks to fabricate the chips. Once a mask fingerprint is identified, manufactured chips can be compared by checking that the same set of SRAMs have a same consistent start up state as the signature bits. This would indicate that the same original design masks were used to fabricate the chips.

At block 306, the mask fingerprint program 110A, 110B measures physical dimensions of various features of the signature bits, such as, for example, contacts and active areas. Such physical measurements may be done on a sample wafer randomly selected for inspection during manufacturing prior to completion at an intermediate stage of fabrication. The sample wafer may be referred to as a pulled wafer or wafer pull. During fabrication of the wafer, several processing steps are performed on the wafer. The processing steps may include level one processing which includes processing active areas of each chip on the wafer. Level two processing may include processing of gate areas of each chip on the wafer. Level three processing may include contact metal layer processing steps. Several processing steps may follow including processing active areas, gate areas and metal layers until the wafer processing is completed. In an embodiment, a wafer may be selected for inspection after the level two processing of gate areas. In such cases, measurements may include widths of gates over an active area. Alternatively, a wafer may be selected for inspection after one or more metal layer processing steps. In such cases, measurements may include widths of a cross couple overlap area. In some embodiments, more than one wafer may be randomly selected for inspection.

The physical measurements taken during manufacturing are then used to confirm that the signature bits have a consistent start up state. A description of physical measurements which can be used to correlate the signature bits follows in the descriptions of FIGS. 4 and 5. The physical measurements may be taken on the signature bits on several chips and on wafers pulled after different intermediate processing steps.

The physical measurements of the signature bits provide a physical indication that correlate with the consistent start up state of each of the signature bits for greater than a second threshold percentage of the time. For example, there may be greater than a second threshold of 70% of the signature bits which have a physical measurement that correlates with the initial start up state. This helps to confirm a physical reason for each of the signature bits to have their consistent start up state.

It is expected that not all signature bits will have physical measurements correlated to them. However, a majority percentage, such as 60-80% of the signature bits should have physical measurement at the critical levels such as gates which correlate to a consistent start up state.

At block 308, the mask fingerprint program 110A, 110B performs a D2DB inspection comparing the chip 212 to the database of the initial design pattern 221 using an e-beam defect inspection tool. The D2DB inspection may be used to confirm that the chip 212 on the wafer pull, has been manufactured according to the original design masks.

At block 310, the mask fingerprint program 110A, 110B tests chips 212 from the wafer 210 which have completed all the manufacturing steps, to confirm the original design masks were used. The mask fingerprint may now be used to exam future wafers manufactured using the same design mask.

The expected start up state of the signature bits may be considered the mask fingerprint. There may be a third threshold percentage of signature bits of the tested completed chip which match the expected start up states. The third threshold may be 75%. For example, if 75% of the SRAM bits match the mask fingerprint then the wafer is considered to be manufactured with the original design masks and considered to have not been altered. This threshold may be adjusted up or down to suit the designers requirements.

Figure 4:
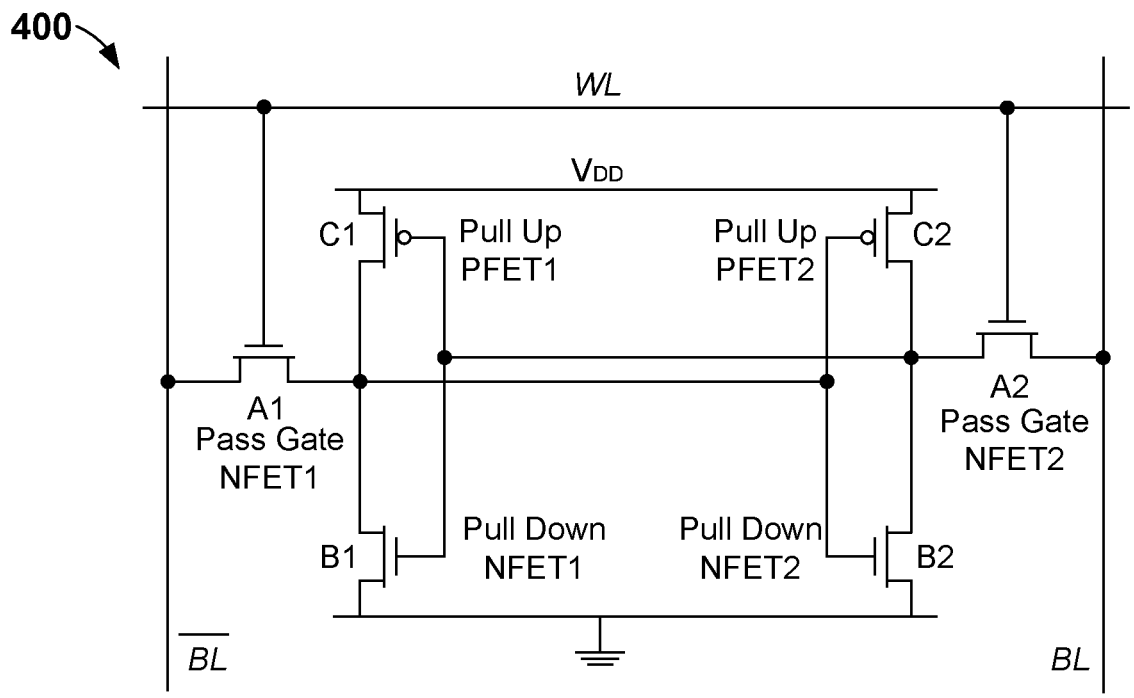
FIG. 4 depicts a circuit diagram, according to an embodiment.
Figure 5:
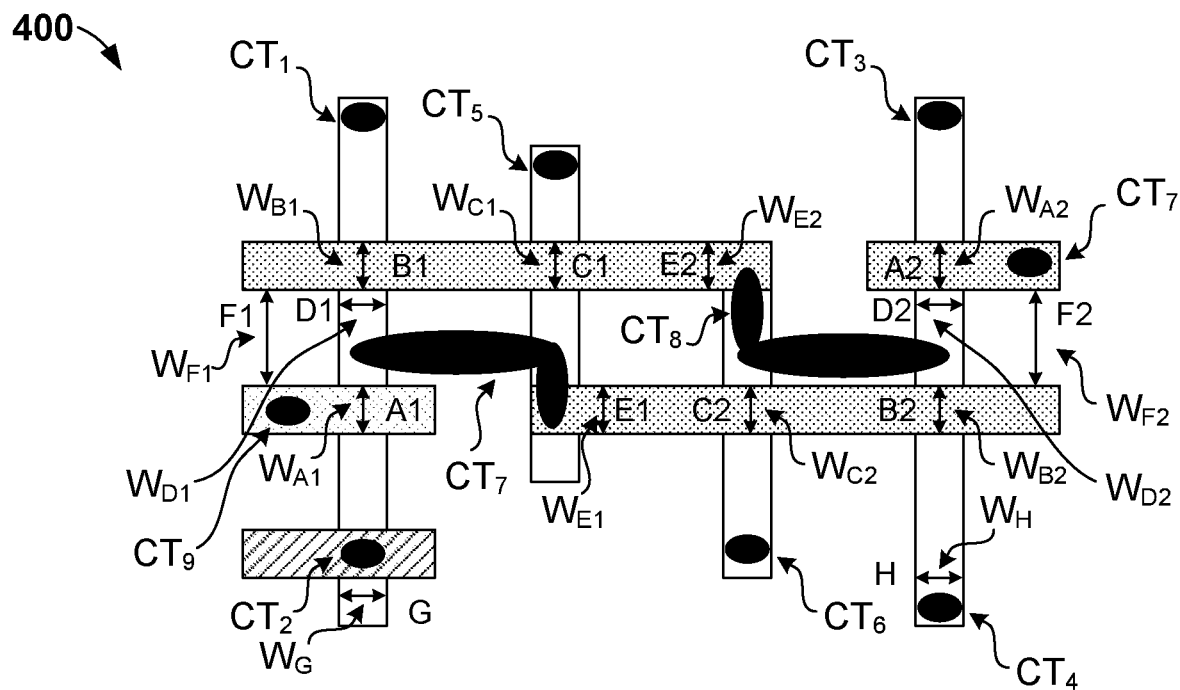
FIG. 5 depicts a top view of a physical layout of the circuit diagram of FIG. 4, according to an embodiment.

Referring now to FIGS. 4 and 5, a SRAM 400 is shown, according to an embodiment. FIG. 4 is a circuit diagram of the SRAM 400. FIG. 5 is a top view of a physical layout of the SRAM 400.

The SRAM 400 includes Pull-Up PFET1 (p-channel FET) or C1 in series with Pull-Down NFET1 (n-channel FET) or B1. A source of the C1 is connected to power $V_{DD}$ and a source of the B1 is connected to ground. The gate of C1 is connected to the gate of B1. The SRAM 400 includes Pull-Up PFET2 or C2 in series with Pull-Down NFET2 or B2. A source of the C2 is connected to power $V_{DD}$ and a source of the B2 is connected to ground. The gate of C2 is connected to the gate of B2.

The SRAM 400 includes Pass Gate NFET1 or A1 with a gate connected to a word line (WL). A source of the A1 is connected to a complementary bit line ($\overline{BL}$) and a drain is connected between a drain of the C1 and a drain of the B2. The connection of the drain of the A1 is also connected to the gates of C2 and B2.

The SRAM 400 includes Pass Gate NFET2 or A2 with a gate connected to the WL. A drain of the A2 is connected to a bit line (BL). A source of the A2 is connected to a drain of the C2 and a drain of the B2. The connection of the source of the A2 is also connected to the gates of C1 and the B1.

As shown in FIG. 5, horizontal lines are gates and vertical lines are active areas. Widths are shown where measurements may be taken of portions of the SRAM 400. The width $W_{A1}$ is a width of the gate of A1 over the active area of A1. The width $W_{A2}$ is a width of the gate of A2 over the active area of A2. The width $W_{B1}$ is a width of the gate of B1 over the active area of B1. The width $W_{B2}$ is a width of the of gate B2 over the active area of B2. The width $W_{C1}$ is a width of the gate of C1 over the active area of C1. The width $W_{C2}$ is a width of the gate of C2 over the active area of C2.

D1 is a measurement of a width of a cross couple overlap area to active area of the B1 where the gate of B1 overlaps. D2 is a measurement of a width of a cross couple overlap area to active area of the A2 where the gate of A2 overlaps.

$W_{E1}$ is a measurement of a width of a cross couple overlap area to gate area contact which extends from the gates of B1 and C1. $W_{E2}$ is a measurement of a width of a cross couple overlap area to gate area contact which extends from the gates of B2 and C2. $W_{F1}$ is a measurement of spacing between the gate of A1 and the gate of B1. $W_{F1}$ is a measurement of spacing between the gate of A2 and the gate of B2.

$W_G$ is a measurement of a width of a metal overlap contact area which extends from the contact between the source of B1 and the drain of A1. $W_H$ is a measurement of width of a contact overlap area which extends from the contact between the source of A2 and the source of B2.

The SRAM 400 includes contacts. $CT_1$ and $CT_2$ are two different contact points for the contact between the drain of A1 and the drain of B1. $CT_3$ and $CT_4$ are two different contact points for the contact between the source of A2 and the source of B1. $CT_5$ is a contact for the contact between the source of B1 and the gates of C2 and B2. $CT_6$ is a contact for the contact between the gates of B2 and C2 and the drain of C1. $CT_7$ is a contact for the contact area between the drain of A1 and the source of B1 and the gates of C2 and B2. $CT_8$ is a contact for the contact area between the source of A2 and the source of B1 and the gates of C1 and B1. $CT_9$ is a contact for the gate of A1.

As described above with respect to the block 306, the mask fingerprint program 110A, 110B measures physical dimensions of contacts and active areas of each signature bit. The physical measurements may be taken at locations of cell features of the SRAM 400 which are mask-sensitive and when differences are found, the differences may account for a consistent start up state of a "1" or a "0" for the SRAM 400.

The physical measurements may include a width of a gate which is nominal or slightly below nominal, such as $W_{A1}$, $W_{A2}$, $W_{B1}$, $W_{B2}$, $W_{C1}$ and $W_{C2}$. The physical measurements may include a cross couple overlap area to gate area which may be minimum or slightly below minimum, such as $W_{E1}$ and $W_{E2}$.

The physical measurements may include a cross couple overlap area to Active Area which may be minimum or slightly below minimum, such as $W_{D1}$ and $W_{D2}$. The physical measurements may include spacing between gates which may be minimum or slightly below minimum, for example as shown on mandrel for side wall image transfer patterning (SIT), such as $W_{F1}$ and $W_{F2}$.

The physical measurements may include metal overlap contact which may be at minimum or below minimum, such as $W_G$. The physical measurements may include contact overlap active area at minimum or below minimum, such as $W_H$.

The physical measurements may be taken of other design feature if also possible, such as contact size.

The portions of the SRAM 400 design are all are very close to fabrication process window, and each portion is sensitive to mask manufacturing random variations that can be translated to the bits being preferred one or zero during start up for all chips. The physical measurements may compare different portions of the SRAM 400, such as a comparison of the C1 to the C2 and a comparison of the B1 to the B2.

Certain combinations of measurement comparisons may explain an SRAM 400 with a consistent start of state of "1" or "0".

An example of an SRAM 400 which may have a consistent start up state may be if the gate of C2, $W_{C2}$, is smaller than the gate of C1, $W_{C1}$, this may lead to a consistent start of state of "1".

An example of an SRAM 400 which may have a consistent start up state may be if the gate of B2, $W_{B2}$, is smaller than the gate of B1, $W_{B1}$, this may lead to a consistent start of state of "0".

It may be appreciated that FIGS. 2-5 provides only an illustration of an implementation and does not imply any limitations with regard to how different embodiments may be implemented. Many modifications to the depicted environments may be made based on design and implementation requirements.

Referring now to FIG. 6, a block diagram of components of a computing device 600, such as the server computer 112 of FIG. 1, in accordance with an embodiment of the present invention is shown. It should be appreciated that FIG. 6, provides only an illustration of an implementation and does not imply any limitations with regard to the environments in which different embodiments may be implemented. Many modifications to the depicted environment may be made.

The computing device may include one or more processors 602, one or more computer-readable RAMs 604, one or more computer-readable ROMs 606, one or more computer readable storage media 608, such as the database 116 of FIG. 1, device drivers 612, read/write drive or interface 614, network adapter or interface 616, all interconnected over a communications fabric 618. Communications fabric 618 may be implemented with any architecture designed for passing data and/or control information between processors (such as microprocessors, communications and network processors, etc.), system memory, peripheral devices, and any other hardware components within a system.

One or more operating systems 610, and one or more application programs 611 are stored on one or more of the computer readable storage media 608 for execution by one or more of the processors 602 via one or more of the respective RAMs 604 (which typically include cache memory). For example, the mask fingerprint program 110A, 110B, may be stored on the one or more of the computer readable storage media 608. In the illustrated embodiment, each of the computer readable storage media 608 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

The computing device may also include the R/W drive or interface 614 to read from and write to one or more portable computer readable storage media 626. Application programs 611 on the computing device may be stored on one or more of the portable computer readable storage media 626, read via the respective RAY drive or interface 614 and loaded into the respective computer readable storage media 608.

The computing device may also include the network adapter or interface 616, such as a TCP/IP adapter card or wireless communication adapter (such as a 4G wireless communication adapter using OFDMA technology). Application programs 611 may be downloaded to the computing device from an external computer or external storage device via a network (for example, the Internet, a local area network or other wide area network or wireless network) and network adapter or interface 616. From the network adapter or interface 616, the programs may be loaded onto computer readable storage media 608. The network may comprise copper wires, optical fibers, wireless transmission, routers, firewalls, switches, gateway computers and/or edge servers.

The computing device may also include a display screen 620, a keyboard or keypad 622, and a computer mouse or touchpad 624. Device drivers 612 interface to display screen 620 for imaging, to keyboard or keypad 622, to computer mouse or touchpad 624, and/or to display screen 620 for pressure sensing of alphanumeric character entry and user selections. The device drivers 612, R/W drive or interface 614 and network adapter or interface 616 may comprise hardware and software (stored on computer readable storage media 608 and/or ROM 606).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access a normalized search engine or related data available in the cloud. For example, the normalized search engine could execute on a computing system in the cloud and execute normalized searches. In such a case, the normalized search engine could normalize a corpus of information and store an index of the normalizations at a storage location in the cloud. Doing so allows a user to access this information from any computing system attached to a network connected to the cloud (e.g., the Internet).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 7:
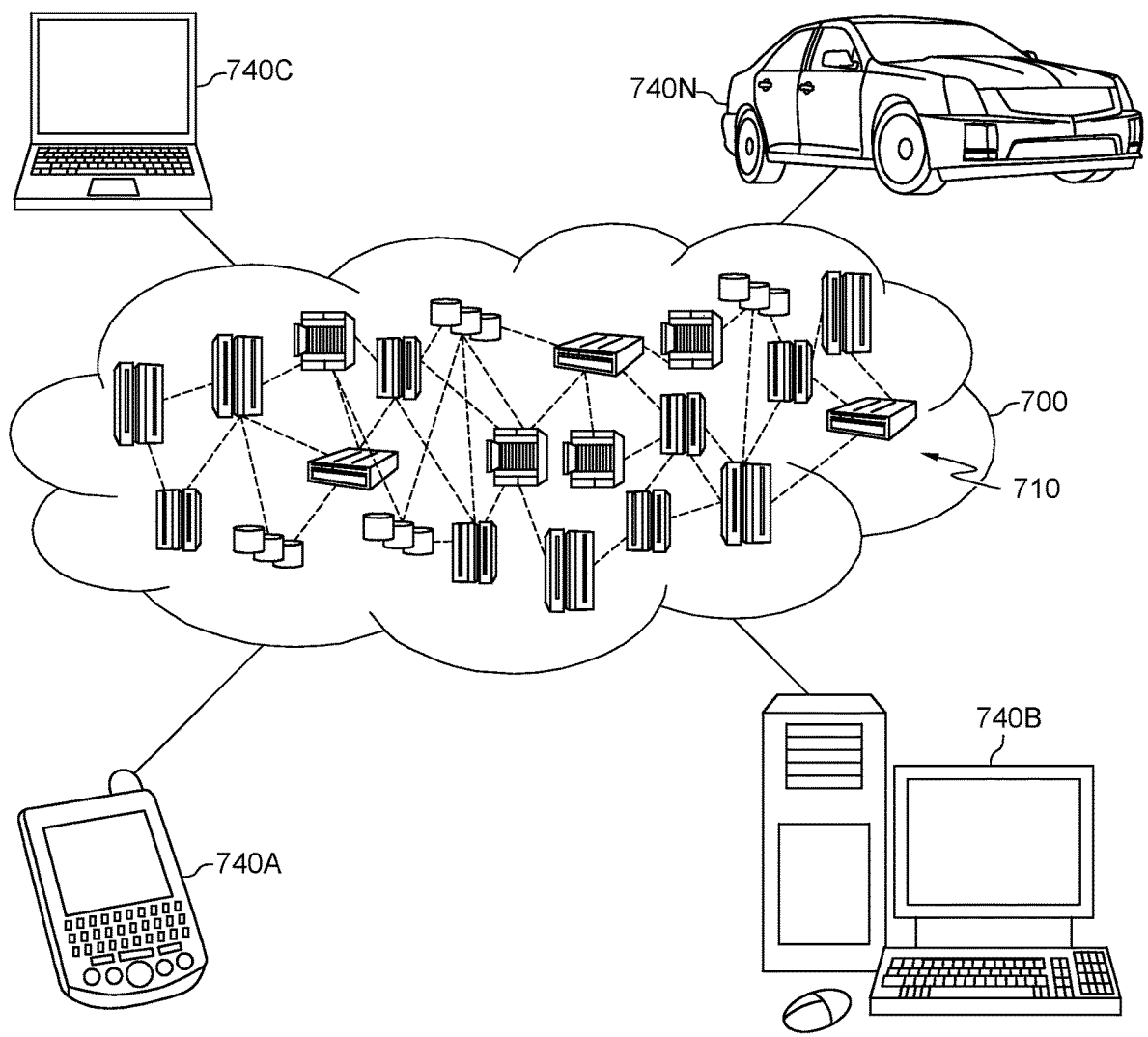
FIG. 7 depicts a cloud computing environment according to an embodiment of the present invention.

Referring now to FIG. 7, illustrative cloud computing environment 700 is depicted. As shown, cloud computing environment 700, or the network 114 of FIG. 1, includes one or more cloud computing nodes 710 with which local computing devices used by cloud consumers, such as, for example, personal digital assistant (PDA) or cellular telephone 740A, desktop computer 740B, laptop computer 740C, and/or automobile computer system 740N may communicate. Cloud computing nodes 710 may communicate with one another. They may be grouped (not shown) physically or virtually, in one or more networks, such as Private, Community, Public, or Hybrid clouds as described hereinabove, or a combination thereof. This allows cloud computing environment 700 to offer infrastructure, platforms and/or software as services for which a cloud consumer does not need to maintain resources on a local computing device. It is understood that the types of computing devices 740A-N shown in FIG. 7 are intended to be illustrative only and that cloud computing nodes 710 and cloud computing environment 700 can communicate with any type of computerized device over any type of network and/or network addressable connection (e.g., using a web browser).

Figure 8:
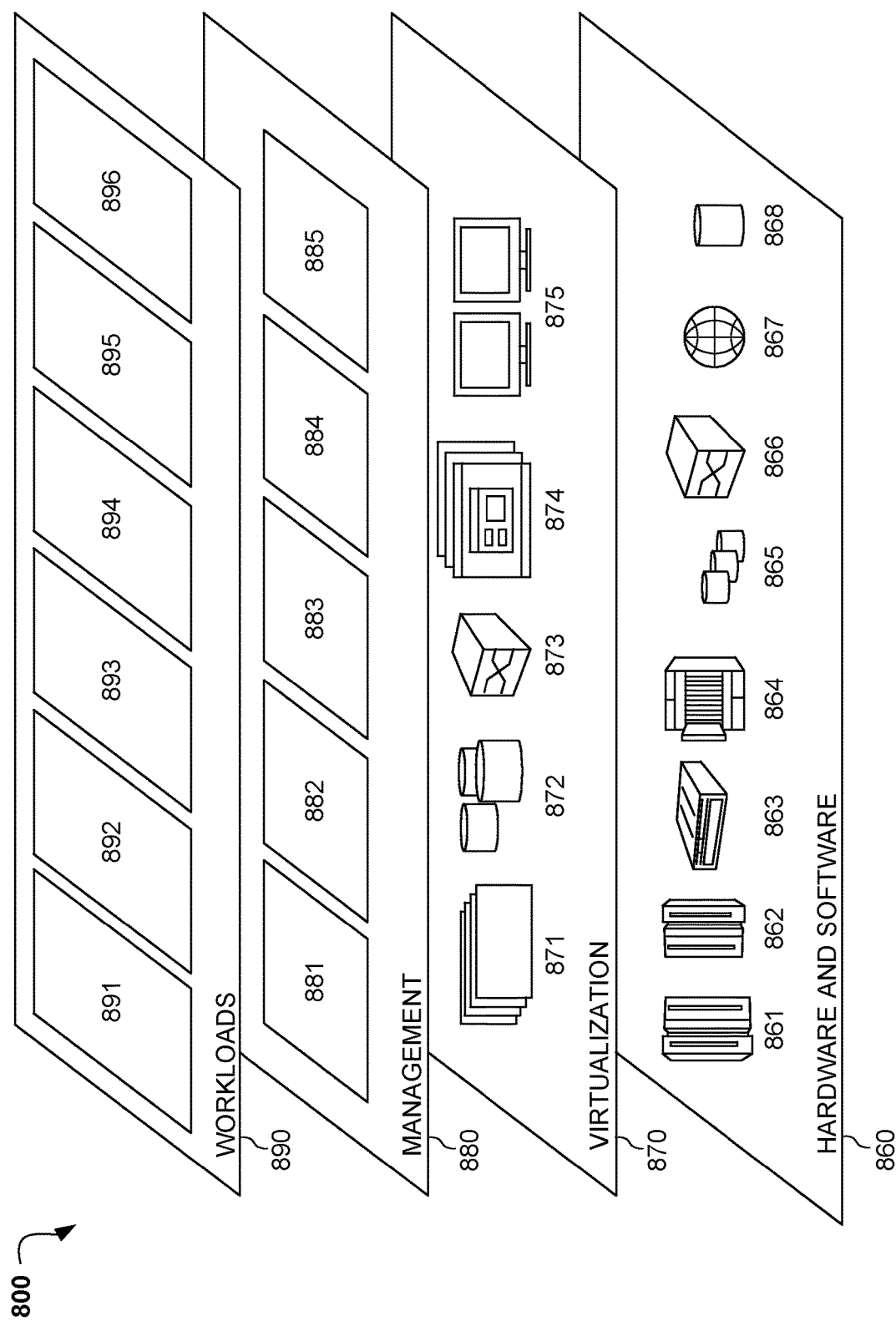
FIG. 8 depicts abstraction model layers according to an embodiment of the present invention.

Referring now to FIG. 8, a set of functional abstraction layers provided by cloud computing environment 700 (as shown in FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 860 includes hardware and software components. Examples of hardware components include: mainframes 861; RISC (Reduced Instruction Set Computer) architecture based servers 862; servers 863; blade servers 864; storage devices 865; and networks and networking components 866. In some embodiments, software components include network application server software 867 and database software 868.

Virtualization layer 870 provides an abstraction layer from which the following examples of virtual entities may be provided: virtual servers 871; virtual storage 872, for example the database 116 as shown in FIG. 1; virtual networks 873, including virtual private networks; virtual applications and operating systems 874; and virtual clients 875.

In an example, management layer 880 may provide the functions described below. Resource provisioning 881 provides dynamic procurement of computing resources and other resources that are utilized to perform tasks within the cloud computing environment. Metering and Pricing 882 provide cost tracking as resources are utilized within the cloud computing environment, and billing or invoicing for consumption of these resources. In an example, these resources may include application software licenses. Security provides identity verification for cloud consumers and tasks, as well as protection for data and other resources. User portal 883 provides access to the cloud computing environment for consumers and system administrators. Service level management 884 provides cloud computing resource allocation and management such that required service levels are met. Service Level Agreement (SLA) planning and fulfillment 885 provide pre-arrangement for, and procurement of, cloud computing resources for which a future requirement is anticipated in accordance with an SLA.

Workloads layer 890 provides examples of functionality for which the cloud computing environment may be utilized. Examples of workloads and functions which may be provided from this layer include: mapping and navigation 891; software development and lifecycle management 892; virtual classroom education delivery 893; data analytics processing 894; transaction processing 895; and wafer confirmation 896. The wafer confirmation 896 may identify bits with a consistent start up state on a chip on a wafer and compare those bits to signature bits for the original design of the wafer to confirm that the wafer is fabricated with the original design masks.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for confirming mask integrity of a first wafer, the method comprising:

measuring an initial state of a set of SRAM bits on the first wafer before testing the first wafer;

identifying a first set of SRAM bits of the set of SRAM bits, wherein the first set of SRAM bits comprise a consistent initial state greater than a first threshold percentage of times;

measuring physical dimensions of features corresponding to each of the first set of SRAM bits on a second wafer selected during manufacturing prior to completion;

identifying a set of signature SRAM bits of the first set of SRAM bits, wherein the set of signature SRAM bits comprise physical dimensions of features which correlate to the initial state of each correlated SRAM bit on the first wafer;

performing a Die to Database (D2DB) inspection of the second wafer by comparing a pattern on the second wafer to an initial design pattern of the mask; and confirming the mask integrity of a third wafer by measuring an initial state of a corresponding set of signature SRAM bits on the third wafer.

2. The method according to claim 1, wherein measuring an initial state of a set of SRAM bits on the first wafer before testing the first wafer comprises identifying a first subset with an initial state of "0" and identifying a second subset with an initial state of "1".

3. The method according to claim 1, wherein confirming the mask integrity of the third wafer further comprises:

confirming the initial state of the corresponding set of signature SRAM bits on the third wafer matches the corresponding set of signature SRAM bits greater than a second threshold of times.

4. The method according to claim 3, wherein the second threshold of times is 75%.

5. The method according to claim 1, wherein the first threshold of times is 80%.

6. A method for confirming mask integrity of a first wafer, the method comprising:

measuring an initial state of a set of SRAM bits on the first wafer before testing the first wafer;

identifying a first set of SRAM bits of the set of SRAM bits, wherein the first set of SRAM bits comprise a consistent initial state greater than a first threshold percentage of times;

measuring physical dimensions of features corresponding to each of the first set of SRAM bits on a second wafer selected during manufacturing prior to completion;

identifying a set of signature SRAM bits of the first set of SRAM bits, wherein the set of signature SRAM bits comprise physical dimensions of features which correlate to the initial state of each correlated SRAM bit on the first wafer; and performing a Die to Database (D2DB) inspection of the second wafer by comparing a pattern on the second wafer to an initial design pattern of the mask.

7. The method according to claim 6, wherein measuring an initial state of a set of SRAM bits on the first wafer before testing the first wafer comprises identifying a first subset with an initial state of "0" and identifying a second subset with an initial state of "1".

8. The method according to claim 6, wherein the second threshold of times is 75%.

9. The method according to claim 6, wherein the first threshold of times is 80%.

10. A method for confirming mask integrity of a first wafer, the method comprising:

measuring an initial state of a set of SRAM bits on the first wafer before testing the first wafer;

identifying a first set of SRAM bits of the set of SRAM bits, wherein the first set of SRAM bits comprise a consistent initial state greater than a first threshold percentage of times;

measuring physical dimensions of features corresponding to each of the first set of SRAM bits on a second wafer selected during manufacturing prior to completion; and identifying a set of signature SRAM bits of the first set of SRAM bits, wherein the set of signature SRAM bits comprise physical dimensions of features which correlate to the initial state of each correlated SRAM bit on the first wafer.

11. The method according to claim 10, wherein measuring an initial state of a set of SRAM bits on the first wafer before testing the first wafer comprises identifying a first subset with an initial state of "0" and identifying a second subset with an initial state of "1".

12. The method according to claim 10, wherein the second threshold of times is 75%.

13. The method according to claim 10, wherein the first threshold of times is 80%.

* * * * *